United States Patent [19]

Yang et al.

[11] 4,379,943
[45] Apr. 12, 1983

[54] CURRENT ENHANCED PHOTOVOLTAIC DEVICE

[75] Inventors: Chi C. Yang, Troy; Arun Madan, Birmingham; Stanford R. Ovshinsky, Bloomfield Hills, all of Mich.; David Adler, Lexington, Mass.

[73] Assignee: Energy Conversion Devices, Inc., Troy, Mich.

[21] Appl. No.: 330,571

[22] Filed: Dec. 14, 1981

[51] Int. Cl.$^3$ .................... H01L 31/06; H01L 31/18
[52] U.S. Cl. .................... 136/249; 136/258; 136/259; 357/2; 357/30; 427/39; 427/74
[58] Field of Search ............ 136/249 TJ, 258 AM, 136/258 PC, 259; 357/2, 30; 427/39, 74

[56] References Cited

FOREIGN PATENT DOCUMENTS 55-157276 12/1980 Japan .................... 136/258 AM

OTHER PUBLICATIONS

M. Moeller et al., "Properties of Fluorinated Amorphous Silicon Solar Cells," *Proceedings, 3rd E.C. Photovoltaic Solar Energy Conf.* (1980), Reidel Pub. Co. (1981), pp. 322-326.
Y. Kuwano et al., "Properties of Amorphous Si:F:H Film & Its Photovoltaic Characteristics," *Japan. J. Appl. Phys.*, vol. 20 (1981), Supplement 20-2, pp. 157-162.
V. K. Dalal, "Design Considerations for a-Si Solar Cells," *IEEE Trans. Electron Devices*, vol. ED-27, pp. 662-670 (1980).
Y. Kuwano et al., "Development of Amorphous Si Solar Cells in Japan," *Proceedings, 3rd E.C. Photovoltaic Solar Energy Conf.* (1980), Reidel Pub. Co. (1981), pp. 309-316.

*Primary Examiner*—Aaron Weisstuch
*Attorney, Agent, or Firm*—Lawrence G. Norris

[57] ABSTRACT

The disclosure is directed to photovoltaic devices having enhanced short circuit currents and efficiencies. The devices are made by depositing on a previously deposited doped amorphous semiconductor alloy layer a body of intrinsic amorphous semiconductor alloys including a first intrinsic layer, adjacent the doped layer, formed from the deposition of a non-etching starting material and a second intrinsic layer different in composition from the first intrinsic layer. The second intrinsic layer preferably includes silicon and fluorine while the first intrinsic amorphous alloy layer does not include fluorine. The first intrinsic layer may be formed by the glow discharge decomposition of silane gas alone. The thicknesses of the first and second intrinsic layers are adjusted so as to match the respective potential drops thereof with the first intrinsic layer being relatively thin as compared to the second intrinsic layer.

116 Claims, 7 Drawing Figures

CURRENT ENHANCED PHOTOVOLTAIC DEVICE

BACKGROUND OF THE INVENTION

This invention relates to photovoltaic devices and a method of making the same wherein the devices are formed from layers of amorphous semiconductor alloys in which the bandgaps thereof can be graded imperceptibly. The devices are formed from layers of amorphous silicon alloys which have different bandgaps. One advantage of this graded material approach is that the devices have improved photoresponsive characteristics for providing enhanced short circuit currents. Another advantage, as explained hereinafter, is that the improved photoresponsive characteristics of fluorinated amorphous silicon alloys can be more fully realized in photovoltaic devices by practicing the present invention. The invention has its most important application in making improved amorphous silicon alloy photovoltaic devices of the p-i-n configuration, either as single cells or multiple cells comprising a plurality of single cell units.

It is well known that grading single phase cyrstalline silicon is an exceptionally difficult if not impossible task since the different band gaps and the lattice mismatch introduce insurmountable problems. This is especially so when indirect band gap materials are utilized and thick materials are required. In amorphous materials, for example, it is not sufficient to list a large array of different amorphous layers that could be graded since in a photovoltaic cell the important parameter is that the intrinsic material has a very low density of states. There are two amorphous materials with low density of states, one is a material deposited from silane and the other is a material that contains fluorine (see for example U.S. Pat. No. 4,217,374 which issued in the names of Stanford R. Ovshinsky and Masatsugu Isu on Aug. 12, 1980 for Amorphous Semiconductors Equivalent to Crystalline Semiconductors and U.S. Pat. No. 4,226,898 which issued in the names of Stanford R. Ovshinsky and Arun Madan on Oct. 7, 1980 under the same title). The fluorinated material is a superior material in every way and it is the bulk intrinsic properties of this material which makes it the basis for a superior amorphous photovoltaic cell. However, fluorine can also be an etchant, which can be a vice or virtue (see for example, U.S. patent application Ser. No. 331,259, filed concurrently herewith). In certain cases, its negative aspects are that by attacking other layers, it can contaminate the intrinsic material by incorporating in them elements such as boron or phosphorus. In order to prevent this problem and to make an improved cell, there is described herein an invention in which the fluorine is utilized for its basic superior qualities and in which a thin layer of material not containing fluorine is utilized to interface a highly doped contact layer which normally would be reactive to fluorine, and the resultant combination brings several unique advantages. There is less potential contamination of the dopants in the fluorinated material, and the non-fluorinated material such as that deposited from silane, can be selected to have a smaller band gap. This increases the current output from such a multi-layer device. Since there is no lattice, there is no lattice mismatch, and both band gaps can be matched without introducing any other materials that might increase the density of states and therefore degrade device performance. The resulting device has sharp junctions, and other advantages can be foreseen.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure cyrstalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other defect problems.

In summary, crystal silicon devices have fixed parameters which are not variable as desired, require large amounts of material, are only producible in relatively small areas and are expensive and time consuming to produce. Devices based upon amorphous silicon alloys can eliminate these crystal silicon disadvantages. An amorphous silicon alloy has an otpical absorption edge having properties similar to a direct gap semiconductor and only a material thickness of one micron or less is necessary to absorb the same amount of sunlight as the 50 micron thick crystalline silicon. Further, amorphous silicon alloys can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. B. Le Comber of Carnegie Laboratory of Physics, University of Dundee, in Dundee, Scotland, did some work on "Substitutional Doping of Amorphous Silicon", as reported in a paper published in *Solid State Communications*, Vol. 17, pp. 1193-1196, (1975), toward the end of reducing the localized states in the energy gap in amorphous silicon or germanium to make the same approximate more closely intrinsic crystalline silicon or germanium and of substitutionally doping the amorphous materials with suitable classic dopants, as in doping cyrstalline materials, to make them extrinsic and of p or n conduction types.

The reduction of the localized states was accomplished by glow discharge deposition of amorphous silicon films wherein a gas of silane (SiH4) was passed through a reaction tube where the gas was decomposed by an r.f. glow discharge and deposited on a substrate at a substrate temperature of about 500°-600° K. (227°-327° C.). The material so deposited on the substrate was an intrinsic amorphous material consisting of silicon and hydrogen. To produce a doped amorphous material a gas of phosphine (PH3) for n-type conduction or a gas of diborane (B2H6) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method however has limitations based upon the fixed ratio of hydrogen to silicon in silane, and various Si:H bonding configurations which introduce new antibonding states. Therefore, there are basic limitations in reducing the density of localized states in these materials.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, which issued in the names of Stanford R. Ovshinsky and Arun Madan on Oct. 7, 1980, and by vapor deposition as fully described in U.S. Pat. No. 4,217,374, which issued in the name of Stanford R. Ovshinsky and Masatsugu Izu, on Aug. 12, 1980, under the same title. As disclosed in these patents, which are incorporated herein by reference, fluorine is introduced into the amorphous silicon semiconductor alloy to substantially reduce the density of localized states therein. Activated fluorine especially readily diffuses into the bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine also combines in a preferable manner with silicon and hydrogen, utilizing the hydrogen in a more desirable manner, since hydrogen has several bonding options. Without fluorine, hydrogen may not bond in a desirable manner in the material, causing extra defect status in the band gap as well as in the material itself. Therefore, fluorine is considered to be a more efficient compensating or altering element than hydrogen when employed alone or with hydrogen because of its high reactivity, specificity in chemical bonding, and high electronegativity.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

Amorphous silicon alloys containing fluorine alone or with hydrogen have thus demonstrated greatly improved characteristics for photovoltaic applications as compared to amorphous silicon alloys containing just hydrogen alone as a density of states reducing element. However, it has been observed that when amorphous silicon alloys containing fluorine are deposited on doped amorphous silicon alloy layers, as by the glow discharge deposition of silicon tetrafluoride and hydrogen for example, small amounts of the material including the dopant of the previously deposited doped layer can be removed and redeposited with the new alloy layer. This can create a relatively thin region of material between the doped layer and the intrinsic layer having multiple phases, possible potential gradients, and a high density of states, all of which can adversely affect the electrical and photo-responsive characteristics of the photovoltaic devices in which they are employed. It is believed that the starting materials for the silicon-fluorine alloy, when decomposed in the glow discharge plasma, become etchants of the previously deposited layer and remove the small amounts of the material by etching the same. This etching continues for only a short period of time until a substantially pure amorphous silicon-fluorine alloy begin to be deposited, resulting in the relatively thin region of deleterious material between the two layers.

The foregoing becomes especially important in the fabrication of photovoltaic devices of the p-i-n configuration. Devices of this type require the deposition of a first doped layer followed by the deposition of an intrinsic layer. If the superior characteristics of amorphous silicon-fluorine alloys are to be fully achieved, it is necessary to deposit the amorphous silicon-fluorine-hydrogen intrinsic alloys without removing and redepositing the material of the doped layer.

Applicants have discovered a new device structure and method of making the same which allows all of the advantages of amorphous silicon-fluorine alloys to be realized in a photovoltaic device of, for example, the p-i-n configuration without forming the previously referred to deleterious region between the first doped layer and the intrinsic layer. Further, the devices and method of the present invention may also be utilized to advantage in multiple cell structures having a plurality of single cell units. The invention also allows the adjusting of the band gaps of the intrinsic and doped layers to maximize the photoresponsive characteristics thereof and the production of amorphous semiconductor single and multiple cell photovoltaic devices of enhanced current capability and efficiency.

SUMMARY OF THE INVENTION

The short circuit current and efficiency of prior art amorphous semiconductor photoresponsive devices are enhanced in accordance with the present invention by depositing on a previously deposited doped amorphous semiconductor alloy layer a body of intrinsic amorphous semiconductor alloys including a first intrinsic layer, adjacent the doped layer, formed from the deposition of a non-etching starting material and a second intrinsic layer different in composition from the first intrinsic layer. The second intrinsic layer preferably includes silicon and fluorine as well as hydrogen while the first intrinsic amorphous alloy layer does not include fluorine. The first intrinsic layer may be formed by the glow discharge decomposition of silane gas alone. The thicknesses of the first and second intrinsic layers are preferably adjusted so as to match the respective potential drops thereof with the first intrinsic layer being relatively thin as compared to the second intrinsic layer. Thus, the majority of the photogenerated electron-hole pairs are produced in the preferred amorphous silicon-fluorine-hydrogen alloy.

The second intrinsic amorphous alloy layer therefore is allowed to incorporate the preferred density of states reducing element, fluorine. The compensating or altering element, fluorine, and/or other elements can be added during deposition or thereafter. Hence, all of the advantages of amorphous silicon-fluorine alloys may be realized without creating a deleterious region between the first doped layer and the intrinsic body.

The short circuit current is further enhanced because amorphous silicon alloys deposited by the glow discharge decomposition of silane without bandgap adjusting elements have a smaller bandgap than do amorphous silicon-fluorine alloys deposited without bandgap adjusting elements. Hence, the first intrinsic layer has a smaller bandgap than the second intrinsic layer. Also, bandgap adjusting elements can be added to the alloys to adjust the bandgaps of each alloy layer or grade the bandgap of the entire intrinsic body to further enhance short circuit current. For example, bandgap decreasing elements such as germanium, tin, or lead and bandgap increasing elements such as carbon or nitrogen can be added to the intrinsic alloy body during deposition.

The devices and method of the present invention can also be utilized in the making of multiple cell devices, such as tandem cells. Again, because the bandgap of the intrinsic layers can be adjusted, the current generating capability of each cell can be maximized for a given different portion of the sun light spectrum. Hence, multiple cells for providing enhanced short circuit current can also be fabricated employing the preferred amorphous-silicon intrinsic alloys without creating a deleterious region between the first doped layer and the intrinsic body.

The present invention finds particular applicability in making photovoltaic devices of the p-i-n configuration. A further doped amorphous silicon alloy layer is deposited on the intrinsic body to create an internal field throughout the intrinsic layer for enabling the collection of the photogenerated electron-hole pairs. Wide bandgap p or n alloys can be employed for the doped layers and a back reflector can also be provided.

DESCRIPTION OF THE PREFERRED EMBODIMENTS

Figure 1:
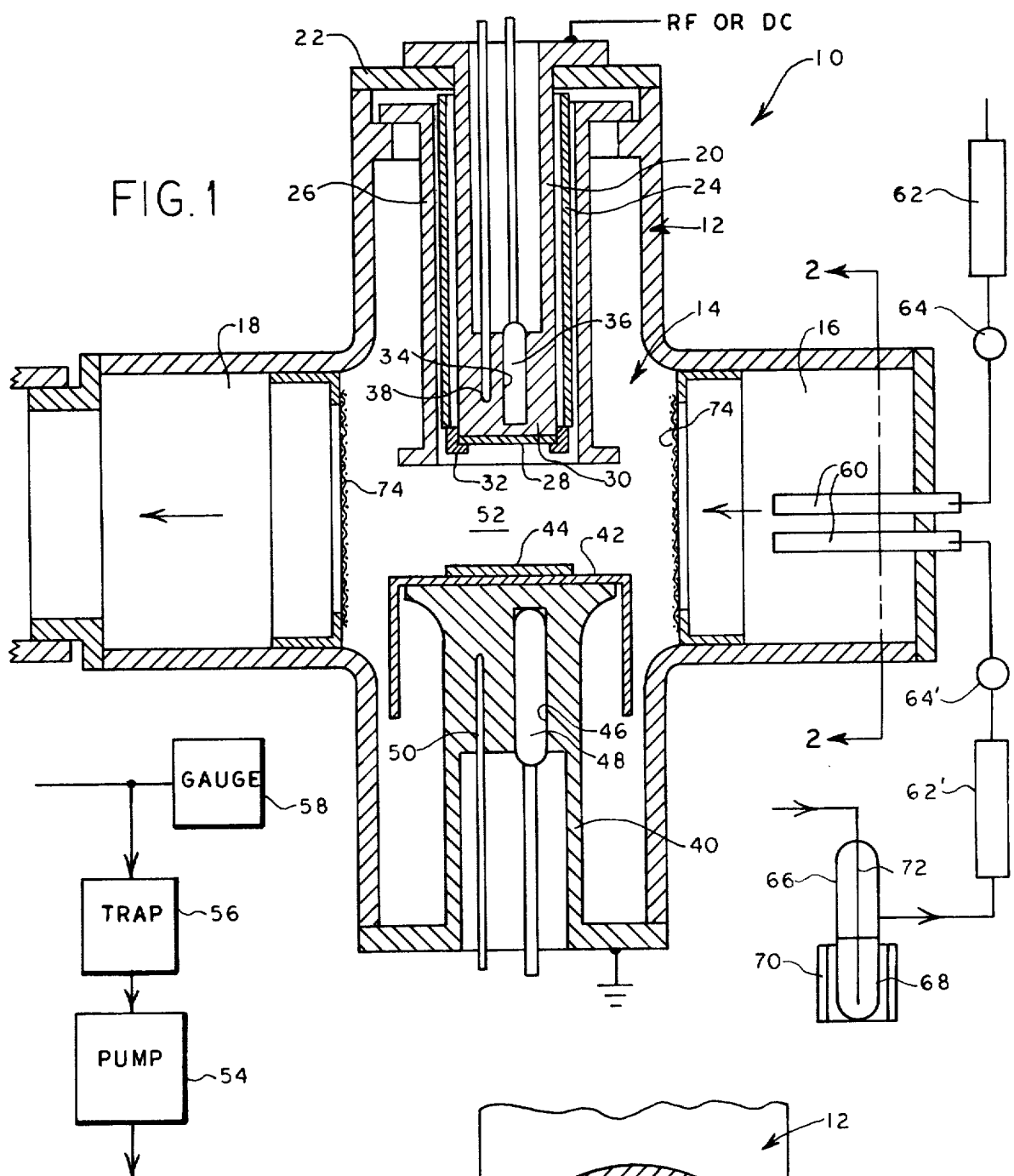
FIG. 1 is a diagrammatic representation of a glow discharge deposition system which may be utilized in practicing the method of the present invention for making the photovoltaic devices of the invention.
Figure 2:
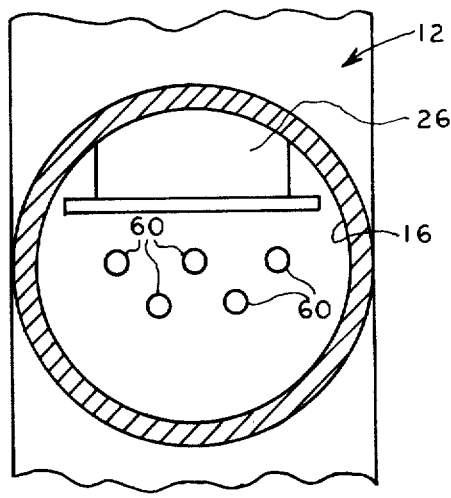
FIG. 2 is a sectional view of a portion of the system of FIG. 1 taken along the lines 2—2 therein.

Referring now more particularly to FIG. 1, there is shown a glow discharge deposition system 10 including a housing 12. The housing 12 encloses a vacuum chamber 14 and includes an inlet chamber 16 and an outlet chamber 18. A cathode backing member 20 is mounted in the vacuum chamber 11 through an insulator 22.

The backing member 20 includes an insulating sleeve 24 circumferentially enclosing the backing member 20. A dark space shield 26 is spaced from and circumferentially surrounds the sleeve 24. A substrate 28 is secured to an inner end 30 of the backing member 20 by a holder 32. The holder 32 can be screwed or otherwise conventionally secured to the backing member 20 in electrical contact therewith.

The cathode backing member 20 includes a well 34 into which is inserted an electrical heater 36 for heating the backing member 20 and hence the substrate 28. The cathode backing member 20 also includes a temperature responsive probe 38 for measuring the temperature of the backing member 20. The temperature probe 38 is utilized to control the energization of the heater 36 to maintain the backing member 20 and the substrate 28 at any desired temperature.

The system 10 also includes an electrode 40 which extends from the housing 12 into the vacuum chamber 14 spaced from the cathode backing member 20. The electrode 40 includes a shield 42 surrounding the electrode 40 and which in turn carries a substrate 44 mounted thereon. The electrode 40 includes a well 46 into which is inserted an electrode heater 48. The electrode 40 also includes a temperature responsive probe 50 for measuring the temperature of the electrode 40 and hence the substrate 44. The probe 50 is utilized to control the energization of the heater 48 to maintain the electrode 40 and the substrate 44 at any desired temperature, independently of the member 20.

A glow discharge plasma is developed in a space 52 between the substrates 28 and 44 by the power generated from a regulated R.F., A.C. or D.C. power source coupled to the cathode backing member 20 across the space 52 to the electrode 40 which is coupled to ground. The vacuum chamber 14 is evacuated to the desired pressure by a vacuum pump 54 coupled to the chamber 14 through a particle trap 56. a pressure gauge 58 is coupled to the vacuum system and is utilized to control the pump 54 to maintain the system 10 at the desired pressure.

The inlet chamber 16 of the housing 12 preferably is provided with a plurality of conduits 60 for introducing materials into the system 10 to be mixed therein and to be deposited in the chamber 14 in the glow discharge plasma space 52 upon the substrates 28 and 44. If desired, the inlet chamber 16 can be located at a remote location and the gases can be premixed prior to being fed into the chamber 14. The gaseous materials are fed into the conduits 60 through a filter or other purifying device 62 at a rate controlled by a valve 64.

When a material initially is not in a gaseous form, but instead is in a liquid or solid form, it can be placed into a sealed container 66 as indicated at 68. The material 68 then is heated by a heater 70 to increase the vapor pressure thereof in the container 66. A suitable gas, such as argon, is fed through a dip tube 72 into the material 68 so as to entrap the vapors of the material 68 and convey the vapors through a filter 62' and a valve 64' into the conduits 60 and hence into the system 10.

The inlet chamber 16 and the outlet chamber 18 preferably are provided with screen means 74 to confine the plasma in the chamber 14 and principally between the substrates 28 and 44.

The materials fed through the conduits 60 are mixed in the inlet chamber 16 and then fed into the glow discharge space 52 to maintain the plasma and deposit the alloy on the substrates with the incorporation of silicon, fluorine, oxygen and the other desired alterant elements, such as hydrogen, and/or dopants or other desired materials.

In operation, and for depositing layers of intrinsic amorphous silicon alloys, the system 10 is first pumped down to a desired deposition pressure, such as less than 20 mtorr prior to deposition. The starting materials or reaction gases such as a non-etching starting material such as silane gas ($SiH_4$), for example, or silicon tetrafluoride ($SiF_4$) and molecular hydrogen ($H_2$) and/or silane are fed into the inlet chamber 16 through separate conduits 60 and are then mixed in the inlet chamber. The gas mixture is fed into the vacuum chamber to maintain a partial pressure therein of about 0.6 torr. A plasma is generated in the space 52 between the substrates 28 and 44 using either a DC voltage of greater than 1000 volts or by radio frequency power of about 50 watts operating at a frequency of 13.56 $MH_z$ or other desired frequency.

In addition to the intrinsic amorphous silicon alloys deposited in the manner as described above, the devices of the present invention as illustrated in the various embodiments to be described hereinafter also utilize doped amorphous silicon alloys. These doped alloy layers are p, p+, n, or n+ type in conductivity and can be formed by introducing an appropriate dopant into the vacuum chamber alone with the non-etching intrinsic starting material such as silane ($SiH_4$) or the silicon tetrafluoride ($SiF_4$) starting material and/or hydrogen and/or silane.

For n or p doped layers, the material can be doped with 5 to 100 ppm of dopant material as it is deposited. For n+ or p+ doped layers, the material is doped with 100 ppm to over 1 percent of dopant material as it is deposited. The n dopants can be phosphorus, arsenic, antimony, or bismuth. Preferably, the n doped layers are deposited by the glow discharge decomposition of at least silicon tetrafluoride ($SiF_4$) and phosphine ($PH_3$). Hydrogen and/or silane gas ($SiH_4$) may also be added to this mixture.

The p dopants can be boron, aluminum, gallium, indium, or thallium. Preferably, the p doped layers are deposited by the glow discharge decomposition of at least silane and diborane ($B_2H_6$) or silicon tetrafluoride and diborane. To the silicon tetrafluoride and diborane, hydrogen and/or silane can also be added.

The doped layers of the devices are deposited at various temperatures in the range of 200° C. to about 1000° C., depending upon the form of the material used and the type of substrate used. For aluminum substrates, the upper temperature should not be above about 600° C. and for stainless steel it could be above about 1000° C. For the intrinsic and doped alloys initially compensated with hydrogen, as for example those deposited from silane gas starting material, the substrate temperature should be less than about 400° C. and preferably about 300° C.

Other materials and alloying elements may also be added to the intrinsic and doped layers to achieve optimized current generation. These other materials and elements will be described hereinafter in connection with the various device configurations embodying the present invention illustrated in FIGS. 3 and 5 through 7.

Figure 3:
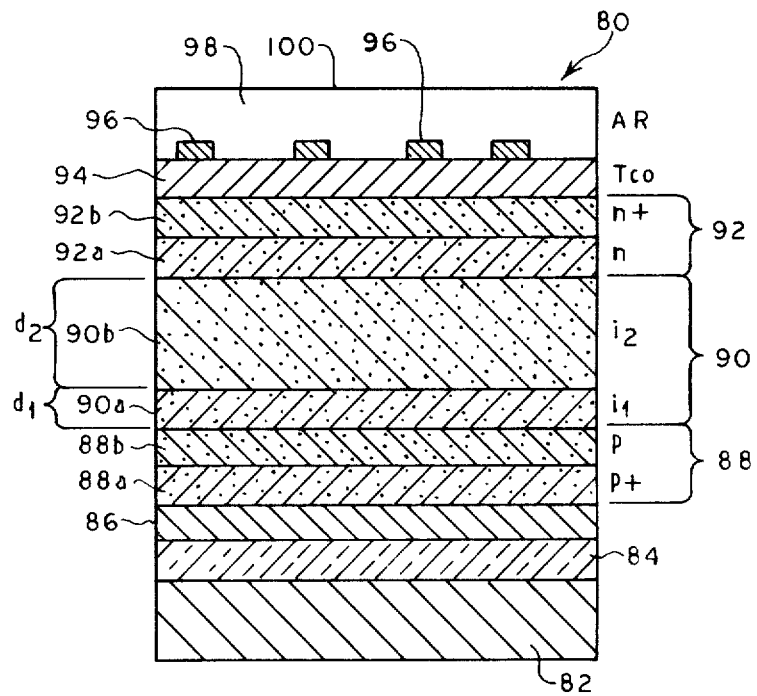
FIG. 3 is a sectional view of a p-i-n photovoltaic device structured in accordance with a first embodiment of the present invention.

Referring now to FIG. 3, it illustrates in sectional view a p-i-n device structured in accordance with a first embodiment of the present invention. The device 80 includes a substrate 82 which may be glass or a flexible web formed from stainless steel or aluminum. The substrate 82 is of a width and length as desired and preferably 3 mils thick. The substrate has an insulating layer 84 deposited thereon by a conventional process such as chemical deposition, vapor deposition or anodizing in the case of an aluminum substrate. The layer 84 for instance, about 5 microns thick can be made of a metal oxide. For an aluminum substrate, it preferably is aluminum oxide ($Al_2O_3$) and for a stainless steel substrate it may be silicon dioxide ($SiO_2$) or other suitable glass.

An electrode 86 is deposited in one or more layers upon the layer 84 to form a base electrode for the cell 80. The electrode 86 layer or layers is deposited by vapor deposition, which is a relatively fast deposition process. The electrode layers preferably are reflective metal electrodes of silver, molybdenum, aluminum, chrome, copper or stainless steel for a solar cell or a photovoltaic device. The reflective electrode is preferable since, in a solar cell, non-absorbed light which passes through the device is reflected from the electrode layer(s) 86 where it again passes through the device which then absorbs more of the light energy to increase the device efficiency.

The substrate 82 is then placed in the glow discharge deposition environment. A first doped amorphous silicon alloy layer 88 is deposited on the substrate. The layer 88 as shown comprises a p+ region 88a and a p region 88b. The p+ region is as thin as possible on the order of 50 to 150 angstroms in thickness which is sufficient for the p+ region to make good ohmic contact with the electrode 86. The p region 88b is on the order of 50 to 500 angstroms in thickness and serves to establish a potential gradient across the device to facilitate the collection of photo induced electron-hole pairs as electrical current. The p+ region 88a and p region 88b can be deposited from any of the gas mixtures previously referred to for the deposition of such material.

A body of intrinsic amorphous silicon alloy 90 is next deposited over the first doped layer 88. The intrinsic body 90 comprises a first layer 90a adjacent the first doped layer 88 and a second layer 90b. The first intrinsic layer 90a is relatively thin, on the order of 500 angstroms, and is deposited from a non-etching starting material such as silane ($SiH_4$) gas. The second intrinsic layer 90b is relatively thick, on the order of 4500 Å, and is deposited from silicon tetrafluoride and hydrogen and/or silane. Because of the presence of the first intrinsic layer, the silicon tetrafluoride disassociated plasma species are not exposed to previously deposited doped material to etch and redeposit. The junction formed between the first doped layer 88 and the intrinsic body therefore does not include a narrow region of deleterious material having a high density of states, potential gradiants or mixed phases. However, the major part of the intrinsic body contains the preferred amorphous silicon alloy compensated with fluorine where the majority of the electron-hole pairs are generated. Hence, the short circuit current of the device is enhanced by the combined efforts of the clean junction between the first doped layer 88 and the intrinsic body 90 and the electron-hole generating portion being primarily an amorphous silicon-fluorine alloy.

Deposited on the intrinsic body 90 adjacent the second intrinsic layer 90b is a further doped layer 92 which is of opposite conductivity with respect to the first doped layer 88. It comprises an n conductivity region 92a and an n+ conductivity region 92b. The n region and n+ region are deposited from any of the gas mixtures previously referred to for the deposition of such material. The n region 92a is deposited to a thickness between 50 and 500 angstroms. The n+ region 92b is deposited to a thickness between 50 and 150 angstroms as a contact layer.

A transparent conductive oxide (TCO) layer 94 is then deposited over the further doped layer 92. The TCO layer 94 can be deposited in a vapor deposition environment and, for example, may be indium tin oxide (ITO), cadmium stannate ($Cd_2SnO_4$), or doped tin oxide ($SnO_2$).

On the surface of the TCO layer 94 is deposited a grid electrode 96 made of a metal having good electrical conductivity. The grid may comprise orthogonally related lines of conductive material occupying only a minor portion of the area of the metallic region, the rest of which is to be exposed to solar energy. For example, the grid 96 may occupy only about from 5 to 10% of the entire area of the metallic region 152. The grid electrode 96 uniformly collects current from the TCO layer 94 to assure a good low series resistance for the device.

To complete the device 80, an anti-reflection (AR) layer 98 is applied over the grid electrode 96 and the areas of the TCO layer 94 between the grid electrode areas. The AR layer 98 has a solar radiation incident surface 100 upon which impinges the solar radiation. For example, the AR layer 98 may have a thickness on the order of magnitude of the wavelength of the maximum energy point of the solar radiation spectrum, divided by four times the index of refraction of the anti-reflection layer 98. A suitable AR layer 98 would be zirconium oxide of about 500 Å in thickness with an index of refraction of 2.1.

The short circuit current of the device is also enhanced because the first and second intrinsic layers 90a and 90b have different bandgaps. The bandgap of the layer 90a, which is an amorphous silicon-hydrogen alloy, is about 1.6 to 1.7 ev while the bandgap of the layer 90b, which is an amorphous silicon-fluorine alloy, is about 1.7 to 1.8 ev. Hence, the bandgap of the second intrinsic layer 90b is greater than the bandgap of the first intrinsic layer 90a. This allows more efficient utilization of the incident sun energy for the generation and collection of electron-hole pairs.

The bandgap of the intrinsic layer 90a and 90b may be adjusted for specific photoresponsive characteristics. For example, one or more bandgap decreasing elements such as germanium, tin, or lead may be incorporated into the first intrinsic layer 90a to decrease the bandgap thereof (see for example U.S. Pat. No. 4,342,044, issued in the names of Stanford R. Ovshinsky and Masatsugu Izu on July 27, 1982 for Method for Optimizing Photoresponsive Amorphous Alloys and Devices). This can be accomplished, for example, by introducing germane gas ($GeH_4$) into the gas mixture from which the layer 90a is deposited. Also, one or more bandgap increasing elements such as nitrogen or carbon may be incorporated into the second intrinsic layer 90b to increase the bandgap thereof (see for example copending U.S. application Ser. No. 206,476 filed in the name of Stanford R. Ovshinsky on Nov. 13, 1980 for Method for Increasing the Band Gap In Photoresponsive Amorphous Alloys and Devices). This can be accomplished, for example, by introducing ammonia gas ($NH_3$) or methane gas (CH$_4$) into the gas mixture from which the layer 90b is deposited.

Figure 4:
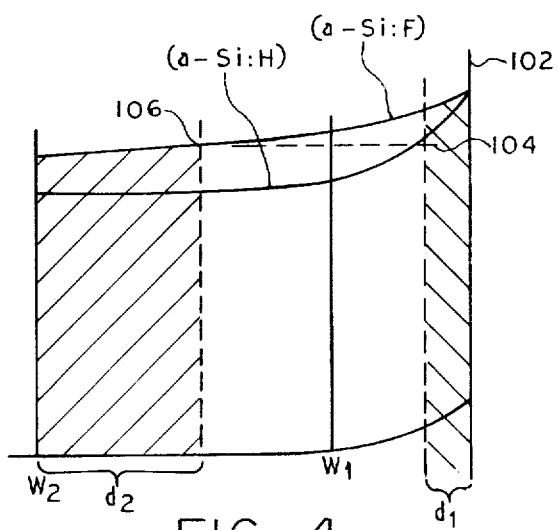
FIG. 4 is a graph illustrating the potential profile n the space charge region of amorphous silicon-hydrogen and amorphous silicon-fluorine alloys which may be utilized for adjusting the thickness of the first and second intrinsic layers for matching their respective potential drops in accordance with the present invention.

In order to obtain full advantage of the new and improved devices of the present invention, it is most desirable to adjust the thicknesses of the first and second intrinsic layers 90a and 90b so as to match their respective potential drops at their interface. This may be best demonstrated by making reference to FIG. 4 which illustrates the potential profile of the amorphous silicon-hydrogen alloy and the amorphous silicon-fluorine-hydrogen alloy in the space charge region thereof created by a Schottky barrier 102.

The depletion width of the amorphous silicon-hydrogen alloy is represented by $W_1$ and the depletion width of the amorphous silicon-fluorine alloy is represented by $W_2$. It will be noted that for a thickness $d_1$ of the first intrinsic a-Si:H alloy layer, the resulting potential drop is represented by a point 104. The appropriate thickness of the second intrinsic a-Si:F alloy layer is determined by the intercept of the a-Si:F potential profile with the potential drop defined by point 104. This results in point 106. The thickness of the a-Si:F intrinsic alloy layer must be sufficient so as to extend from point 106 to the end of its depletion width. Hence, the thickness of the second intrinsic layer must be $d_2$ to match the potential drop of the first intrinsic alloy layer.

Figure 5:
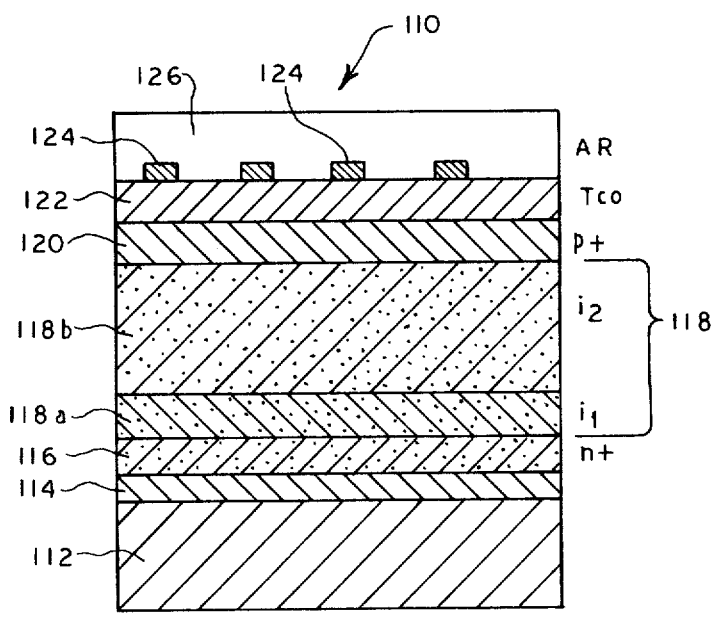
FIG. 5 is a sectional view of another p-i-n photovoltaic device embodying the present invention.

Referring now to FIG. 5, it illustrates another device 110 embodying the present invention. The device 110 is similar to the device of FIG. 3 except for a different substrate configuration and reversal of the p and n type layers. The substrate 112 of the device 110 can be glass or stainless steel for example and has a reflecting layer 114 thereon. The reflecting layer 114 can be deposited by any of the processes previously referred to for such a layer and can be formed from silver, aluminum, or copper, for example.

Deposited on the reflecting layer 114 is a first doped layer 116 which, as illustrated, is of n+ conductivity. The n+ layer 116 may include a bandgap increasing element such as nitrogen or carbon to form a wide bandgap n+ layer.

An intrinsic body 118 is deposited on the n+ layer 116 and, like the intrinsic body 90 of device 80, includes a first amorphous intrinsic Si:H alloy layer 118a formed from a non-etching starting material such as silane and a second amorphous intrinsic alloy layer 118b which is different in composition that the first layer 118a. The second intrinsic layer 118b is preferably an amorphous silicon-fluorine alloy of a thickness so that the potential drop of layer 118b matches the potential drop of layer 118b.

Deposited on the intrinsic body 118 is a further doped layer 120 which is opposite in conductivity with respect to the first doped layer 116. Hence, the further doped layer 120 is of p+ conductivity and preferably is a wide bandgap p+ layer incorporating carbon and/or nitrogen.

The device is completed by the forming of a TCO layer 122 over the p+ layer 120, a grid electrode 124 on the TCO layer 122, and an anti-reflection layer 126. These steps can be accomplished in a manner as described with respect to the device 80 of FIG. 3.

As in the case of the previous embodiment, the bandgaps of one or both of the intrinsic layers 118a and 118b can be adjusted for a particular photoresponse characteristic with the incorporation of bandgap increasing or decreasing elements into the layers. Also, the p+ layer 120 and n+ layer 116 can be reversed so that the p+ layer is adjacent the substrate and the n+ layer is adjacent the second intrinsic layer 118b.

As a further alternative, the bandgap of the intrinsic body 118 can be graded so as to be gradually increasing from the interface between the first doped layer 116 and the first intrinsic layer 118a to the further doped layer 120 (see for example copending U.S. application Ser. No. 206,579 filed in the names of Stanford R. Ovshinsky and David Adler on Nov. 13, 1980 for Methods for Grading the Band Gaps of Amorphous Alloys and Devices). For example, as the first and second intrinsic layers 118a and 118b are deposited, one or more bandgap decreasing elements such as germanium, tin, or lead can be incorporated in the alloys in gradually decreasing concentration. Germane gas (GeH$_4$), for example, can be introduced into the glow discharge deposition chamber from a relatively high concentration at first and gradually diminished thereafter as the intrinsic layers are deposited to a point where such introduction is terminated. The resulting intrinsic body will thus have a bandgap decreasing element, such as germanium, therein in gradually decreasing concentrations from the interface of the first intrinsic layer 118a and first doped layer 116 towards the further doped layer 120.

Figure 6:
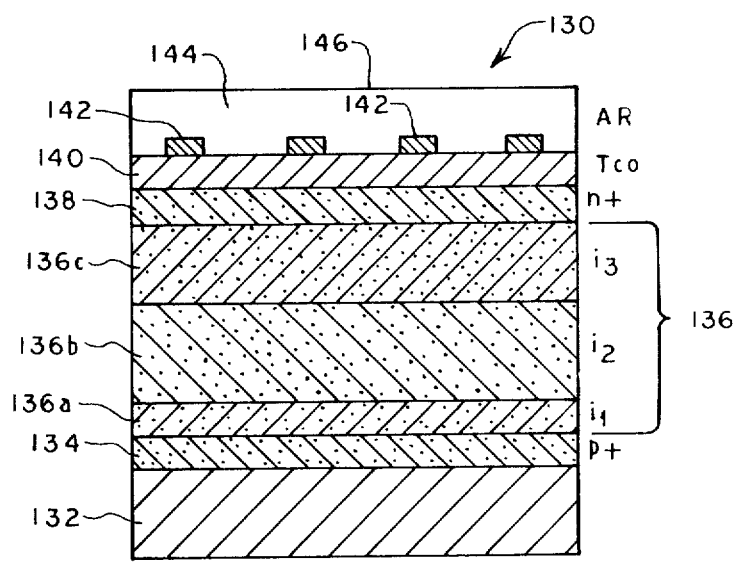
FIG. 6 is a sectional view of a p-i-n photovoltaic device employing a body of intrinsic alloys including three intrinsic layers in accordance with a further embodiment of the invention.

Referring now to FIG. 6, it illustrates that any number of intrinsic layers may be utilized to form the intrinsic body. Here, a device 130 includes a substrate 132 formed from a metal of good conductivity, such as stainless steel. Deposited on the substrate is a p+ layer 134. An intrinsic body 136 is formed on the p+ layer 134 and an n+ layer 138 is deposited on the intrinsic body. The device is completed with the forming of a TCO layer 140, an electrode grid 142, and an antireflection layer 144.

The intrinsic body 136 comprises three intrinsic amorphous silicon alloy layers 136a, 136b, and 136c. The first intrinsic layer 136a is deposited from a non-etching starting material, such as silane to form an a-Si:H alloy. The second intrinsic layer 136b and third intrinsic layer 136c are preferably a-Si:F alloys. The thickness of the intrinsic layers 136a, 136b, and 136c are preferably selected so that the potential drop of layer 136b matches the potential drop of layer 136a, and the potential drop of layer 136c matches the potential drop of layer 136b. This selection can be accomplished in the manner described with respect to the potential profiles of FIG. 4.

The bandgaps of the three intrinsic layers can be adjusted in a manner as previously described. With the device 130 having a radiant energy incident surface 146, the bandgap of the third layer 136c can be increased, for example, with the incorporation of nitrogen or carbon into the layer 136c. The bandgap of the second intrinsic layer 136b can be either its intrinsic bandgap of about 1.9 eV or decreased slightly with the incorporation of germanium, tin, or lead. The bandgap of the first intrinsic layer 136a can be decreased to a greater extent with the incorporation of higher percentages of one or more bandgap decreasing elements such as germanium, tin, or lead.

Figure 7:
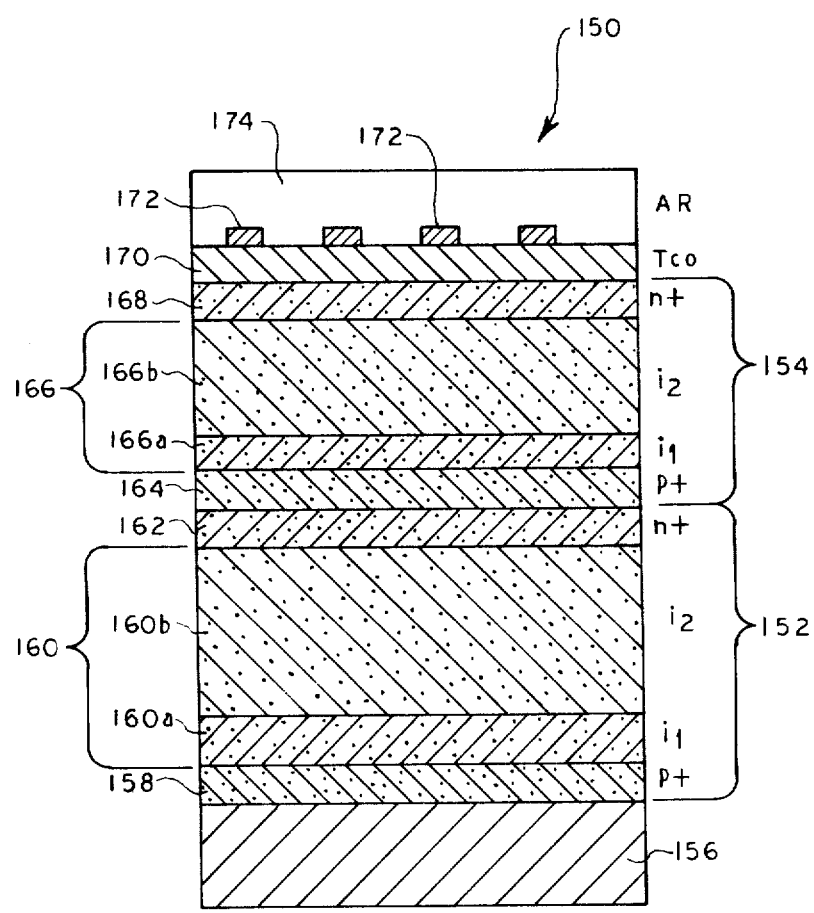
FIG. 7 is a sectional view of a multiple solar cell incorporating a plurality of p-i-n photovoltaic cell units arranged in tandem configuration in accordance with the present invention.

Referring now to FIG. 7, a multiple cell device 150 is there illustrated in sectional view which is arranged in tandem configuration. The device 150 comprises two single cell units 152 and 154 arranged in series relation which embody the present invention. As can be appreciated, plural single cell units of more than two can be utilized.

The device 150 includes a substrate 156 formed from a metal having good electrical conductivity, such as stainless steel or aluminum, for example. The first cell unit 152 includes a first doped p+ amorphous silicon alloy layer 158 deposited on the substrate 156. The p+ layer can be deposited from any of the previously mentioned starting materials for depositing such material.

Deposited on the p+ layer is a first intrinsic amorphous silicon alloy body 160. The first intrinsic alloy body 160, in accordance with the present invention, includes a first intrinsic layer 160a and a second intrinsic layer 160b. The first intrinsic layer 160a is deposited from a non-etching starting material such as silane. The second intrinsic layer 160b is deposited from a different starting material and preferably is an amorphous silicon-fluorine alloy. The thickness of the second layer 160b is preferably selected for matching the voltage drop of the layer 160b with the voltage drop of layer 160a.

Deposited on the second intrinsic layer 160b is a further doped amorphous silicon alloy layer 162. It is opposite in conductivity with respect to the conductivity of the first doped layer 158 and thus is an n+ layer.

The second unit cell 154 is essentially identical and includes a first doped p+ layer, an intrinsic body 166 including a first intrinsic layer 166a and a second intrinsic layer 166b with the potential drops thereof matched and a further doped n+ layer 168. The device 150 is completed with a TCO layer 170, a grid electrode 172, and an anti-reflection layer 174.

As in the case of the device previously described, the conductivity type of the respective doped layers can be reversed. Also, the doped layer 168 can also be a wide bandgap doped layer by introducing one or more bandgap increasing elements such as nitrogen or carbon therein in a manner as previously described.

The bandgaps of the intrinsic layers are preferably adjusted so that the bandgap of layer 166b is greater than the bandgap of layer 166a, the bandgap of layer 166a is greater than the bandgap of layer 160b, and the bandgap of layer 160b is greater than the bandgap of layer 160a. To that end, the alloy forming layer 166b can include one or more bandgap increasing elements such as nitrogen and carbon. To a lesser concentration, the alloy forming layer 166a can also include one or more bandgap increasing elements. The intrinsic alloys forming the intrinsic layers 160b and 160a can include one or more bandgap decreasing elements such as germanium, tin, or lead. The concentration of the bandgap decreasing element or elements in the alloy forming layer 160a is greater than the concentration of such elements in the alloy of layer 160b. Of course, in adjusting the bandgaps of the intrinsic layers 166b, 166a, 160b, and 160a in the order as mentioned above, it may be desirable to not adjust one of the intrinsic alloy layers in the middle of the device, in this case layer 160b or 166a.

It can be noted from the figure that each second intrinsic layer of each unit cell is thicker than its corresponding first intrinsic layer to achieve potential drop matching. It can also be noted that both the first and second intrinsic layers of cell unit 154 are thinner than the corresponding first and second intrinsic layers of cell unit 152. This allows the entire usable spectrum of the solar energy to be utilized for generating electron-hole pairs.

Although a tandem cell embodiment has been shown and described herein, the unit cells can also be isolated from one another with oxide layers for example to form a stacked multiple cell. Each cell could include a pair of collection electrodes to facilitate the series connection of the cells with external wiring.

As a further alternative, and as mentioned with respect to the single cells previously described, one or more of the intrinsic bodies of the unit cells can include alloys having graded bandgaps. Anyone or more of the bandgap increasing or decreasing elements previously mentioned can be incorporated into the intrinsic alloys for this purpose. Reference may also be made to co-pending U.S. application Ser. No. 206,579 filed in the names of Stanford R. Ovshinsky and David Adler on Nov. 13, 1980 for Multiple Cell Photoresponsive Amorphous Alloys and Devices.

For each embodiment of the invention described herein, the alloy layers other than the intrinsic alloy layers can be other than amorphous layers, such as polycrystalline layers. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the scope of the appended claims the invention may be practiced otherwise than as specifically described.

What is claimed and described to be secured by Letters Patent of the United States is:

1. A photovoltaic device formed from multiple layers of semiconductor alloys deposited on a substrate which provides increased short circuit current, said device comprising:
a first doped semiconductor alloy layer deposited on said substrate;
a body of an intrinsic amorphous semiconductor alloy deposited on said doped layer, said body including a first layer adjacent said first doped layer formed from the deposition of a non-etching starting material and a second layer different in composition from said first layer; and
a further doped semiconductor alloy layer deposited on said second intrinsic layer and being of opposite conductivity with respect to said first mentioned doped amorphous semiconductor alloy layer.

2. A device as defined in claim 1 wherein each said first and second intrinsic alloy layers has a band gap and wherein the band gap of said second intrinsic alloy layer is different than the band gap of said first intrinsic alloy layer.

3. A device as defined in claim 2 wherein the band gap of said second intrinsic alloy layer is greater than the band gap of said first intrinsic alloy layer.

4. A device as defined in claim 1 wherein at least one of said doped semiconductor alloy layers is polycrystalline.

5. A device as defined in claim 1 wherein said doped semiconductor alloy layers are amorphous.

6. A device as defined in claim 5 wherein said doped and intrinsic amorphous alloy layers include at least silicon.

7. A device as defined in claim 6 wherein said second intrinsic amorphous silicon alloy layer includes at least one density of states reducing element, said element being fluorine.

8. A device as defined in claim 7 wherein said first intrinsic amorphous silicon alloy layer includes at least hydrogen.

9. A device as defined in claim 8 wherein said first intrinsic amorphous silicon alloy layer is deposited by the glow discharge decomposition of at least a silicon containing gas.

10. A device as defined in claim 8 wherein said first doped amorphous silicon alloy layer includes at least hydrogen.

11. A device as defined in claim 10 wherein said first doped amorphous silicon alloy layer includes a p-dopant.

12. A device as defined in claim 11 wherein said p-dopant is at least one of the group consisting of boron, gallium, indium, or thallium.

13. A device as defined in claim 12 wherein said first doped amorphous silicon alloy layer is deposited by the glow discharge decomposition of silane gas (SiH$_4$) and diborane (B$_2$H$_6$).

14. A device as defined in claim 7 or 10 wherein said first doped amorphous silicon alloy layer is formed by the glow discharge decomposition of at least silane gas (SiH$_4$).

15. A device as defined in claim 8 wherein said first doped amorphous silicon alloy layer includes at least one density of states reducing element, said element being fluorine.

16. A device as defined in claim 15 wherein said first doped amorphous silicon alloy layer is deposited by the glow discharge decomposition of a florine containing compound.

17. A device as defined in claim 15 wherein said first doped amorphous silicon alloy layer includes a p-dopant.

18. A device as defined in claim 17 wherein said p-dopant is at least one of the group consisting of boron, aluminum, gallium, indium, or thallium.

19. A device as defined in claim 18 wherein said first doped amorphous silicon alloy layer is deposited by the glow discharge decomposition of at least silicon tetrafluoride (SiF$_4$) and diborane (B$_2$H$_6$).

20. A device as defined in claim 15 wherein said first doped amorphous silicon alloy layer includes an n-dopant.

21. A device as defined in claim 20 wherein said n-dopant is at least one of the group consisting of phosphorus, arsenic, antimony or bismuth.

22. A device as defined in claim 21 wherein said first doped amorphous silicon alloy layer is deposited by the glow discharge decomposition of at least silicon tetrafluoride (SiF$_4$) and phosphine (PH$_3$).

23. A device as defined in claim 8 wherein said first doped amorphous silicon alloy layer includes at least one band gap increasing element.

24. A device as defined in claim 23 wherein said at least one band gap increasing element is carbon or nitrogen.

25. A device as defined in claim 23 further comprising a radiant energy reflecting layer disposed between said first doped amorphous silicon alloy layer and said substrate.

26. A device as defined in claim 25 wherein said reflecting layer is formed from one of the group consisting of silver, aluminum, or copper.

27. A device as defined in claim 25 wherein said second intrinsic silicon alloy layer is deposited by the glow discharge decomposition of at least silicon tetrafluoride (SiF$_4$) and hydrogen and/or silane gas (SiH$_4$).

28. A device as defined in claim 8 wherein said first intrinsic amorphous silicon alloy layer includes at least one band gap decreasing element.

29. A device as defined in claim 28 wherein said at least one band gap decreasing element is selected from the group consisting of germanium, tin, and lead.

30. A device as defined in claim 8 wherein said second intrinsic amorphous silicon alloy layer includes at least one band gap decreasing element.

31. A device as defined in claim 30 wherein said at least one band gap decreasing element is selected from the group consisting of germanium, tin, and lead.

32. A device as defined in claim 8 wherein said second intrinsic amorphous silicon alloy layer includes at least one band gap increasing element.

33. A device as defined in claim 32 wherein said at least one band gap increasing element is carbon or nitrogen.

34. A device as defined in claim 32 wherein said at least one band gap increasing element is either nitrogen or carbon.

35. A device as defined in claim 8 wherein said further doped amorphous silicon alloy layer includes an n-dopant.

36. A device as defined in claim 35 wherein said n-dopant is at least one of the group consisting of phosphorus, arsenic, antimony, or bismuth.

37. A device as defined in claim 35 wherein said further doped amorphous silicon alloy layer further includes at least one density of states reducing element, said element being fluorine.

38. A device as defined in claim 37 wherein said further doped amorphous silicon alloy layer further includes hydrogen.

39. A device as defined in claim 37 wherein said further doped amorphous silicon alloy layer is deposited by the glow discharge decomposition of at least silicon tetrafluoride (SiF$_4$), phosphine (PH$_3$) and hydrogen and/or silane gas (SiH$_4$).

40. A device as defined in claim 8 wherein said further doped amorphous silicon alloy layer includes a p-dopant.

41. A device as defined in claim 40 wherein said p-dopant is at least one of the group consisting of boron, aluminum, gallium, indium, or thallium.

42. A device as defined in claim 40 wherein said further doped amorphous silicon alloy layer further includes at least one density of states reducing element, said element being fluorine.

43. A device as defined in claim 42 wherein said further doped amorphous silicon alloy layer further includes hydrogen.

44. A device as defined in claim 43 wherein said further doped amorphous silicon alloy layer is deposited by the glow discharge decomposition of at least silicon tetrafluoride (SiF$_4$), diborane (B$_2$H$_6$) and hydrogen and/or silane gas (SiH$_4$).

45. A device as defined in claim 43 wherein said further doped amorphous silicon alloy layer further includes hydrogen.

46. A device as defined in claim 45 wherein said further doped amorphous silicon alloy layer is deposited by the glow discharge decomposition of at least silane gas (SiH$_4$) and diborane (B$_2$H$_6$).

47. A device as defined in claim 8 wherein at least said first intrinsic layer includes a band gap decreasing element and wherein the concentration of said band gap decreasing element decreases from the interface of said first mentioned doped layer and said first intrinsic layer towards said further doped layer.

48. A device as defined in claim 8 including a third intrinsic amorphous silicon alloy layer deposited on said second intrinsic layer.

49. A device as defined in claim 48 wherein said third intrinsic alloy layer includes at least one density of states reducing element, said element being fluorine.

50. A device as defined in claim 49 wherein said third intrinsic alloy layer further includes a band gap increasing element.

51. A device as defined in claim 50 wherein each said first, second, and third intrinsic alloy layers have a band gap, wherein the band gap of said second intrinsic alloy layer is greater than the band gap of said first intrinsic alloy layer, and wherein the band gap of said third intrinsic alloy layer is greater than the band gap of said second intrinsic alloy layer.

52. A device as defined in claim 50 wherein said band gap increasing element is carbon or nitrogen.

53. A device as defined in claim 48 wherein said third intrinsic alloy layer is of a predetermined thickness for matching the potential drop of said third layer to the potential drop of said second layer.

54. A device as defined in claim 7 wherein said second intrinsic amorphous silicon alloy layer is deposited by the glow discharge decomposition of at least silicon tetrafluoride ($SiF_4$).

55. A device as defined in claim 7 wherein said second intrinsic silicon alloy layer further includes hydrogen.

56. A device as defined in claim 7 wherein said further doped amorphous silicon alloy layer further includes at least one band gap increasing element.

57. A device as defined in claim 56 further comprising a radiant energy reflecting layer disposed between said first doped amorphous silicon alloy layer and said substrate.

58. A device as defined in claim 57 wherein said reflecting layer is formed from one of the group consisting of silver, aluminum, or copper.

59. A device as defined in claim 1 wherein said intrinsic amorphous alloy body has a band gap, and wherein said band gap varies from the interface of said first doped alloy layer and said first intrinsic alloy layer to said further doped alloy layer.

60. A device as defined in claim 59 wherein said band gap increases from said interface of said first doped alloy layer and said first intrinsic alloy layer to said further doped alloy layer.

61. A device as defined in claim 1 wherein said second intrinsic layer is of a predetermined thickness for matching the potential drop of said first intrinsic layer.

62. A device as defined in claim 1 wherein said first intrinsic layer is relatively thin compared to the thickness of said second intrinsic layer.

63. A photovoltaic device formed from multiple layers of amorphous silicon alloys deposited on a substrate which provides improved current generating capability, said device comprising:
a first doped amorphous silicon alloy layer deposited on said substrate by the flow discharge decomposition of silane gas ($SiH_4$) and diborane;
a first intrinsic amorphous silicon alloy layer deposited on said first doped layer by the glow discharge decomposition of at least silane gas ($SiH_4$);
a second intrinsic amorphous silicon alloy layer deposited on said first intrinsic layer by the glow discharge decomposition of at least silicon tetrafluoride ($SiF_4$) and hydrogen and/or silane gas ($SiH_4$); and
a further doped amorphous silicon alloy layer deposited on said second intrinsic layer by the glow discharge decomposition of at least silicon tetrafluoride ($SiF_4$), phosphine ($PH_3$), and hydrogen and/or silane gas ($SiH_4$).

64. A multiple cell photovoltaic device formed from multiple layers of amorphous semiconductor alloys deposited on a substrate, said device comprising:
a plurality of single cell units arranged in series relation, each said single cell unit comprising a first doped amorphous semiconductor alloy layer, a body of an intrinsic amorphous semiconductor alloy deposited on said doped layer, said intrinsic body including a first layer adjacent said first doped layer formed from the deposition of a non-etching starting material and a second intrinsic layer different in composition from said first layer, and a further doped amorphous semiconductor alloy layer deposited on said second intrinsic layer and being of opposite conductivity with respect to said first mentioned doped amorphous semiconductor alloy layer.

65. A device as defined in claim 64 wherein each said first and second intrinsic alloy layer of each said cell unit has a band gap and wherein the band gap of the second intrinsic alloy layer of a given cell unit is greater than the band gap of the first intrinsic alloy layer of said given cell unit.

66. A device as defined in claim 64 wherein said doped and intrinsic amorphous alloy layers of each said cell unit include at least silicon.

67. A device as defined in claim 66 wherein said second intrinsic amorphous silicon alloy layer of each said cell unit includes at least one density of states reducing element, said element being fluorine.

68. A device as defined in claim 67 wherein said first intrinsic amorphous silicon alloy layer of each said cell unit includes at least hydrogen.

69. A device as defined in claim 68 wherein said first intrinsic amorphous silicon alloy layer of each said cell unit is deposited by the glow discharge decomposition of at least silane gas ($SiH_4$).

70. A device as defined in claim 68 wherein said first mentioned doped amorphous silicon alloy layer of each said cell unit includes at least hydrogen.

71. A device as defined in claim 70 wherein said first doped amorphous silicon alloy layer of each said cell unit is formed by the glow discharge decomposition of at least silane gas ($SiH_4$).

72. A device as defined in claim 68 wherein said first doped amorphous silicon alloy layer of each said cell unit includes at least one density of states reducing element, said element being fluorine.

73. A device as defined in claim 72 wherein said first doped amorphous silicon alloy layer of each said cell unit is deposited by the glow discharge decomposition of at least silicon tetrafluoride ($SiF_4$).

74. A device as defined in claim 73 wherein said first doped amorphous silicon alloy layer of each said cell unit includes a p-dopant.

75. A device as defined in claim 74 wherein said p-dopant is at least one of the group consisting of boron, aluminum, gallium, indium, or thallium.

76. A device as defined in claim 75 wherein said first doped amorphous silicon alloy layer of each said cell unit is deposited by the glow discharge decomposition of at least silicon tetrafluoride ($SiF_4$) and diborane ($B_2H_6$).

77. A device As defined in claim 73 wherein said first doped amorphous silicon alloy layer of each said cell unit includes an n-dopant.

78. A device as defined in claim 77 wherein n-dopant is at least one of the group consisting of phosphorus, arsenic, antimony, or bismuth.

79. A device as defined in claim 68 wherein said first intrinsic amorphous silicon alloy layer of at least one said cell unit includes at least one band gap decreasing element.

80. A device as defined in claim 79 wherein said at least one band gap decreasing element is selected from the group consisting of germanium, tin, and lead.

81. A device as defined in claim 68 wherein said second intrinsic amorphous silicon alloy layer of at least one said cell unit includes at least one band gap decreasing element.

82. A device as defined in claim 81 wherein said at least one band gap decreasing element is selected from the group consisting of germanium, tin, and lead.

83. A device as defined in claim 68 wherein said further doped amorphous silicon alloy layer of each said cell unit includes an n-dopant.

84. A device as defined in claim 83 wherein said n-dopant is at least one of the group consisting of phosphorus, arsenic, antimony, or bismuth.

85. A device as defined in claim 83 wherein said further doped amorphous silicon alloy layer of each said cell unit further includes hydrogen.

86. A device as defined in claim 85 wherein said further doped amorphous silicon alloy layer of each said cell unit is deposited by the glow discharge decomposition of at least silicon tetrafluoride ($SiF_4$), phosphine ($PH_3$) and hydrogen and/or silane gas ($SiH_4$).

87. A device as defined in claim 68 wherein said first intrinsic layer of at least one said cell unit includes a band gap decreasing element and wherein the concentration of said band gap decreasing element decreases from the interface of said first mentioned doped layer and said first intrinsic layer toward said further doped layer of said at least one cell unit.

88. A device as defined in claim 67 wherein said second intrinsic amorphous silicon alloy layer of each said cell unit is deposited by the glow discharge decomposition of at least silicon tetrafluoride ($SiF_4$).

89. A device as defined in claim 67 wherein said second intrinsic silicon alloy layer of each said cell unit further includes hydrogen.

90. A device as defined in claim 89 wherein said second intrinsic silicon alloy layer of each said cell unit is deposited by the glow discharge decomposition of at least silicon tetrafluoride ($SiF_4$) and hydrogen and/or silane gas ($SiH_4$).

91. A device as defined in claim 67 wherein said further doped amorphous silicon alloy layer of at least one said cell unit further includes at least one band gap increasing element.

92. A device as defined in claim 91 wherein said at least one band gap increasing element is either nitrogen or carbon.

93. A device as defined in claim 64 wherein said first doped amorphous silicon alloy layer of each said cell unit includes a p-dopant.

94. A device as defined in claim 93 wherein said p-dopant is at least one of the group consisting of boron, aluminum, gallium, indium, or thallium.

95. A device as defined in claim 94 wherein said first doped amorphous silicon alloy layer of each said cell unit is deposited by the glow discharge decomposition of silane gas ($SiH_4$) and diborane ($B_2H_6$).

96. A device as defined in claim 64 wherein said second intrinsic layer of each said cell unit is of a predetermined thickness for matching the potential drop of each said second intrinsic layer to the potential drop of each corresponding first intrinsic layer.

97. A device as defined in claim 96 wherein said first intrinsic layers are relatively thin compared to the thickness of said second intrinsic layers.

98. A multiple cell photovoltaic device formed from multiple layers of amorphous silicon alloys deposited on a substrate which provides improved current generating capability, said device comprising:
a plurality of single cell units arranged in series relation, each said single cell unit comprising a first doped amorphous silicon alloy layer deposited on said substrate by the glow discharge decomposition of at least silane gas ($SiH_4$) and diborane; a first intrinsic amorphous silicon alloy layer deposited on said first doped layer by the glow discharge decomposition of at least silane gas ($SiH_4$); a second intrinsic amorphous silicon alloy layer deposited on said first intrinsic layer by the glow discharge decomposition of at least silicon tetrafluoride ($SiF_4$) and hydrogen and/or silane gas ($SiH_4$); and a further doped amorphous silicon alloy layer deposited on said second intrinsic layer by the glow discharge decomposition of at least silicon tetrafluoride ($SiF_4$), phosphine $PH_3$, and hydrogen and/or silane gas ($SiH_4$).

99. A method of making a photovoltaic device having multiple layers of amorphous semiconductor alloys deposited on a substrate; said method comprising the steps of:
depositing a first doped amorphous semiconductor alloy layer on said substrate;
depositing a first intrinsic amorphous semiconductor alloy layer on said first doped layer from a non-etching starting material;
depositing a second intrinsic amorphous semiconductor alloy layer on said first intrinsic layer from a starting material different in composition from said non-etching starting material; and
depositing a further doped amorphous semiconductor alloy layer on said second intrinsic layer from a dopant starting material which renders said further doped layer opposite in conductivity with respect to said first doped amorphous semiconductor alloy layer.

100. A method as defined in claim 99 wherein each said amorphous semiconductor alloy layer is deposited by glow discharge deposition.

101. A method as defined in claim 100 wherein each said amorphous semiconductor alloy layer is deposited from a starting material including at least silicon.

102. A method as defined in claim 99 wherein said first mentioned doped amorphous semiconductor alloy layer is deposited from at least silane gas ($SiH_4$) and a p-dopant.

103. A method as defined in claim 102 wherein said p-dopant is diborane.

104. A method as defined in claim 99 wherein said starting material for depositing said first intrinsic amorphous semi-conductor layer includes silane gas ($SiH_4$).

105. A method as defined in claim 104 wherein said first intrinsic layer starting material also includes at least one band gap decreasing element.

106. A device as defined in claim 105 wherein said at least one band gap decreasing element is selected from the group consisting of germanium, tin, or lead.

107. A method as defined in claim 99 wherein said second intrinsic layer starting material includes silicon tetrafluoride ($SiF_4$) gas.

108. A method as defined in claim 107 wherein said second intrinsic layer starting material further includes hydrogen and/or silane gas ($SiH_4$).

109. A method as defined in claim 107 wherein said second intrinsic layer starting material further includes at least one band gap decreasing element.

110. A method as defined in claim 109 wherein said band gap decreasing element is selected from the group consisting of germanium, tin, or lead.

111. A method as defined in claim 109 wherein the concentration of said at least one band gap decreasing element is decreased from the interface of said first and second intrinsic layers towards said further doped layer.

112. A method as defined in claim 99 wherein said further doped amorphous semiconductor layer starting material includes at least silicon tetrafluoride ($SiF_4$) and an n-dopant.

113. A method as defined in claim 112 wherein said n-dopant is phosphine gas ($PH_3$).

114. A method as defined in claim 112 wherein said further doped layer starting material further includes at least one band gap increasing element.

115. A method as defined in claim 114 wherein said at least one band gap increasing element is carbon or nitrogen.

116. A method as defined in claim 99 comprising the additional step of adjusting the thicknesses of said first and second intrinsic layers to match the potential drop of said layers.

* * * * *